Sept. 29, 1970 U. PELLEGRINI 3,531,797

APPARATUS FOR IMPROVING THE DIFFERENTIAL LINEARITY OF ANALOG-TO-DIGITAL CONVERTERS

Filed Feb. 23, 1966 3 Sheets-Sheet 1

Sept. 29, 1970 U. PELLEGRINI 3,531,797
APPARATUS FOR IMPROVING THE DIFFERENTIAL LINEARITY OF ANALOG-TO-DIGITAL CONVERTERS
Filed Feb. 23, 1966 3 Sheets-Sheet 2

United States Patent Office 3,531,797

Patented Sept. 29, 1970

3,531,797

APPARATUS FOR IMPROVING THE DIFFERENTIAL LINEARITY OF ANALOG-TO-DIGITAL CONVERTERS

Umberto Pellegrini, Milan, Italy, assignor to LABEN Laboratori Elettronici e Nucleari S.r.l., Milan, Italy Filed Feb. 23, 1966, Ser. No. 538,130

Claims priority, application Italy, Feb. 23, 1965, 3,887/65

Int. Cl. H03k 13/02

U.S. Cl. 340—347 4 Claims

ABSTRACT OF THE DISCLOSURE

Described is an analog-to-digital converter provided with an additional circuitry for improving its differential linearity by classification of pulses depending on amplitude through introduction of pairs of thresholds relating to a plurality of the channels of the converter for the classification in each single channel. The converter comprises: a single decoding circuit for generating, in a first operation of the conversion, an auxiliary analog step and for generating, in a second operation of the conversion, an analog comparison sample for the amplitude sum of the amplitude of said auxiliary step plus the amplitude of the input pulse to be classified; a first and a second control circuit associated to said single decoding circuit for actuating it in said two operations, said control circuits generating the digital values corresponding to said auxiliary step and to said amplitude sum; a comparator associated to an analog memory circuit for the storage of said amplitude sum and connected to said first control circuit and to said single decoding circuit for effecting, in said second conversion operation, the comparison of said amplitude sum stored in said analog memory circuit with the output signal of said single decoding circuit; and an output register receiving said digital values generated by said control circuits for effecting their differentation, the result of the differentiation consisting of the digital value corresponding to the input amplitude.

The invention relates to an apparatus for improving the differential linearity of analog-to-digital converters.

It is known to "minimize," for example, in analog-to-digital converters of the ladder network type, the influence of the imprecision of the thresholds of the converter which define a channel or classification interval in the operation of classification of the pulses having amplitudes in the range between levels K and $K+1$ (where K is a generic threshold), by using, in accordance with a a given law, pairs of thresholds $K+S$, $K+S+1$, in order to reduce the error of differential linearity, wherein S is an auxiliary signal the amplitude of which corresponds to a level or threshold variable between 0 and N, and assumes all the values from 0 to N. The choice of N depends on the characteristics of the converter and on the wanted improvement of its differential linearity.

The possibility of using a plurality of thresholds $K+S$, $K+S+1$, by varying S in order to carry out an amplitude measure of pulses having amplitudes compressed in the generic range K, $K+1$, can be achieved, for example, by adding a step or amplitude pulse corresponding to S to the pulse to be classified and by subtracting the digital signal corresponding to the amplitude of S from the output digital signal of the converter during the conversion operation. This is achieved by carrying out simultaneous operations in which an amplitude pulse or step corresponding to S is added to the pulse to be classified depending on amplitude and, during the conversion operation, a weight corresponding to S is subtracted from the ladder digital signal corresponding to the resulting amplitude of the input pulse and of the added auxiliary step. In order to carry out simultaneous operation it is necessary to provide the converter with an auxiliary decoding circuit in addition to a main decoding circuit. When two decoding circuits are used and there exists a difference of some percent units or of fractions of a percent unit between the weights of the two decoding circuits, then systematic conversion errors, even of various classification intervals or channels, are liable to occur. Thus, the conversion of pulses having a constant amplitude by varying the weight S, would be classified not in a single channel but in a plurality of channels due to the difference between the weights of the two decoding circuits which difference can even become equal to various channels by varying S. The weights of the two decoding circuits however can be made to coincide by a critical setting of the apparatus used in the conversion, though drifts and fluctuation with time of the electronic components used and of the circuitry parameters are liable to lead the apparatus out of said setting conditions, thus again introducing the possibility of conversion errors.

The invention simplifies the conversion operation in that it eliminates the auxiliary decoding circuit or generator and thereby avoids the aforesaid conversion errors.

The invention provides a method for improving the differential linearity of analog-to-digital converters by classification of the pulses through introduction of pairs of thresholds relating to a plurality of channels for the classification in a single channel, wherein the conversion operation is performed with a sequence in time consisting of two successive operations, in the first of which an auxiliary step is added to the pulse to be converted and in the second of which a comparison sample for the amplitude sum is introduced, said auxiliary step and said comparison sample coming from a single source which is active in the two operations of the sequence.

The addition of the auxiliary pulse or step and the successive introduction of the comparison simple is preferably achieved by using a single generator in the form of a ladder network decoding circuit.

The invention further provides apparatus for improving the differential linearity of analog-to-digital converters comprising a single generator for both the auxiliary step and the comparison sample, a comparator fed by the voltage pulse to be classified depending on amplitude, and a stretcher or analog memory circuits. The single generator of the auxiliary pulse and of the comparison sample preferably comprises a ladder network decoding circuit.

The invention will hereinafter be described by way of example and in relation to the known case where a main and an auxiliary decoding circuit is used, with reference to the accompanying drawings in which.

Figure 1:
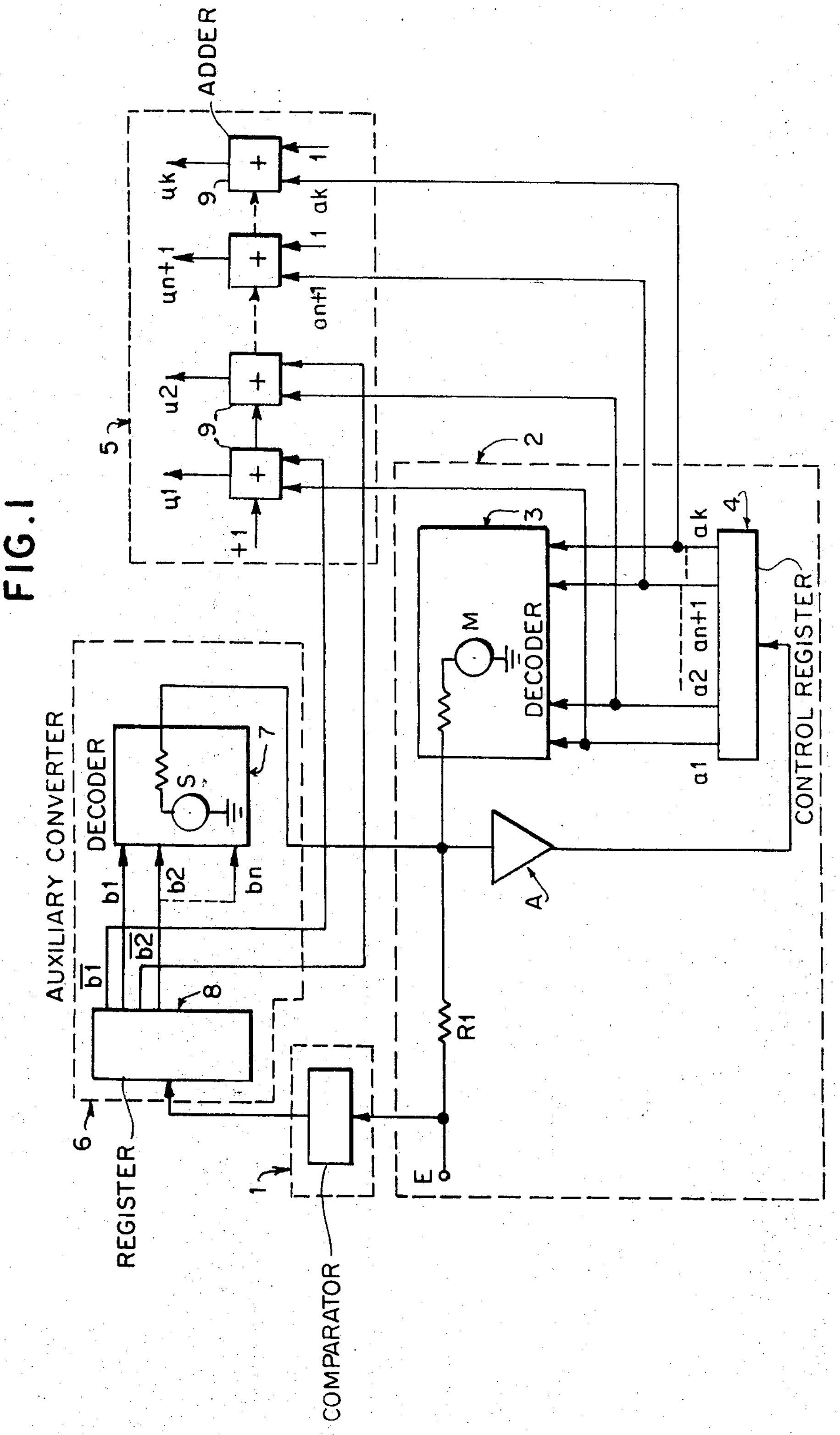
FIG. 1 is a block circuit diagram of a known analog-to-digital converter provided with two decoding circuits, and capable of carrying out simultaneous operations.

The apparatus shown in FIG. 1 consists of a discriminator 1 fed by the pulse E to be classified, a main trial and error calculator 2 comprising a decoding circuit 3 and a control or sequential logic circuit 4, an output register 5 for the coded outputs, a virtual ground comparator circuit A, and an auxiliary trial and error circuit 6 comprising a decoding circuit 7 and a sequential logic control circuit 8.

The auxiliary trial and error circuit 6 operates so as to add analogically an auxiliary weight S to the pulse E to be coded. During the conversion the signal resulting from the addition of (a) the signal E to be coded, (b) the auxiliary weight S and (c) the main weights i.e. the comparison sample supplied by the main decoding circuit 3, through the virtual ground comparator circuit A, actuates the circuit of the control circuit 4 to control the main trial and error calculator 2. The output register 5, comprising a plurality of adding blocks 9, is provided in order to supply the coded outputs (bit $u_1, u_2, \ldots u_k$) resulting from the difference between the main weights $E+S$ given in the coded form by bits $a_1, a_2 \ldots a_k$, and the auxiliary weights S given in the coded form by bits $b_1, b_2, \ldots b_n$. The bits $\bar{b}_1, \bar{b}_2 \ldots \bar{b}_n$ are the complements of $b_1, b_2 \ldots b_n$.

It will be seen that in the above sequence of operations it is necessary to use, in addition to the main decoding circuit 3, the auxiliary decoding circuit 7. In the preferred embodiments according to the invention shown in FIGS. 2 and 3, only a single decoding circuit 3 is used to perform the conversion operation with a sequence consisting of two successive operations in which the single decoding circuit 3 supplies an auxiliary step during a first part of the sequence and also supplies the sample weight of comparison in the second part of the sequence.

In the first of the above said operations the single decoding circuit 3 is used to supply the step or variable auxiliary weight S to be added to the amplitude of the pulse E to be classified. The analog value $E+S$ is then stored in an analog memory circuit or stretcher. In the successive second operation of the same sequence, conversion of the value $E+S$ into the digital form is performed again using the single decoding circuit 3 which supplies a sample weight of comparison. It is in this that the possibility of systematic errors in the conversion operation is eliminated since the value S is always determined by the single decoding circuit 3 which operates both during the addition of the weight S and during the conversion of the resulting signal $E+S$.

Figure 2:
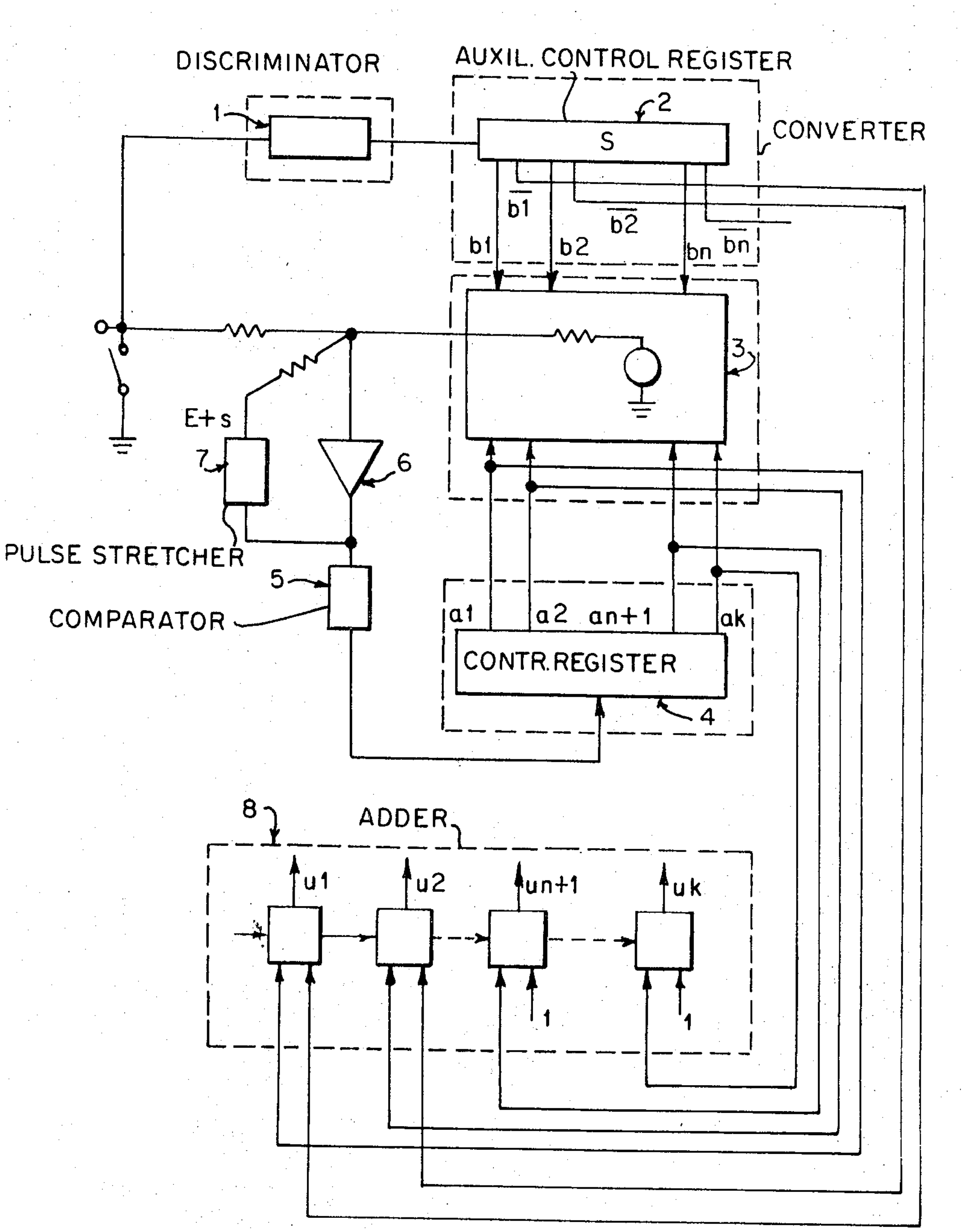
FIG. 2 is a block diagram circuit of an analog-to-digital converter according to the invention, comprising only one decoding circuit adapted to carry out successive operations.
Figure 3:
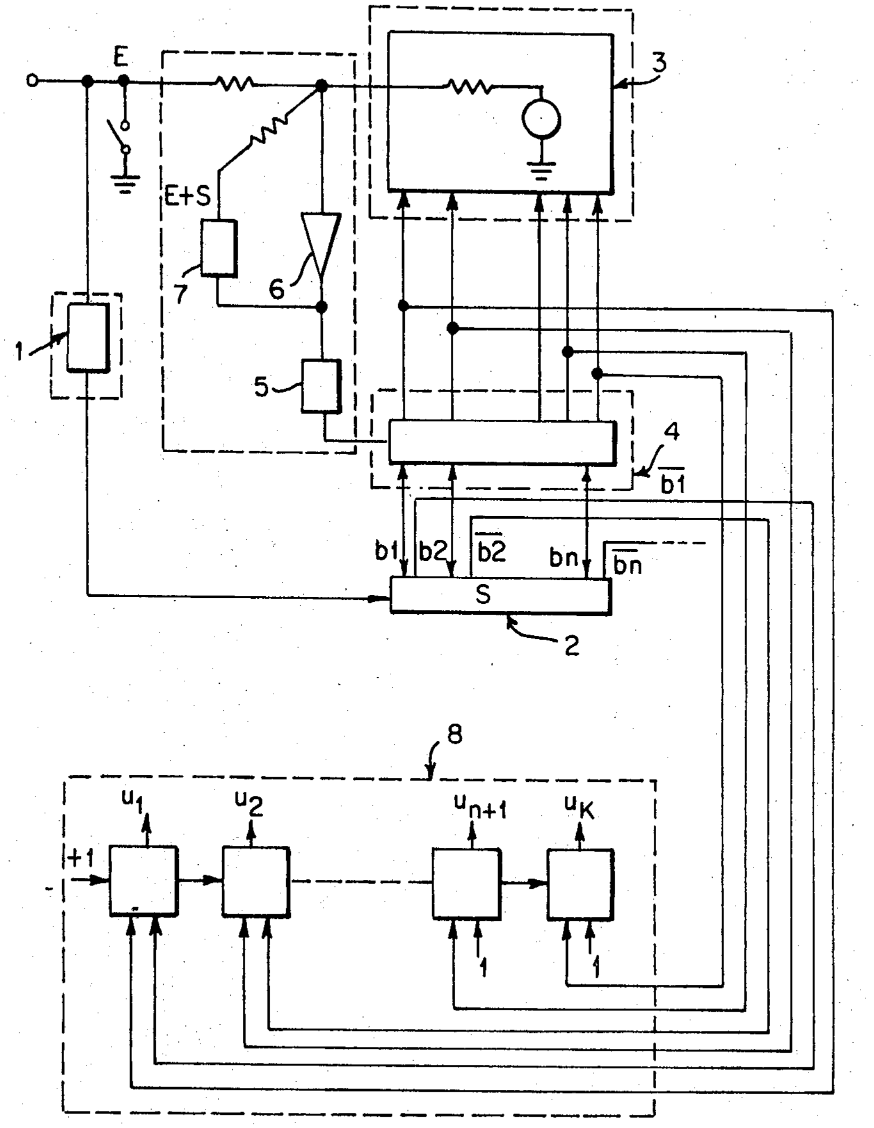
FIG. 3 is an alternative arrangement of the analog-to-digital converter shown in FIG. 2.

Thus, the apparatus shown in FIGS. 2 and 3 for carrying out the above said successive operations, comprises the discriminator 1, the control circuit 4, auxiliary control circuit 8, a single decoding circuit 3, a linear amplifier B, a comparator 10, the analog memory circuit or stretcher 11, and the output register or digital added 5, connected together as shown respectively in FIGS. 2 and 3.

As regards the scheme of FIG. 2, its working will now be described.

In the addition of auxiliary weight S in the first operation, the single decoding circuit 3 is actuated by the auxiliary control circuit 8, which is in turn controlled by the discriminator 1, as soon as an input signal or pulse E to be classified presents itself. The sum value of amplitude E and of the weight S, determined by the auxiliary control circuit 8, is memorized in the analog memory circuit or stretcher 11. During this first operation the control circuit 4 is inactive.

The second or successive operation for analog-to-digital conversion is made by actuating the single decoding circuit 3 by means of the control circuit 4. During this operation the input of signal E is kept at zero and the decoding circuit 3 is then actuated, as a second operation, in order to convert value $E+S$ stored in the analog memory circuit 11. In this way the digital value of S is stored in the auxiliary control circuit 8, while in the control circuit 4, at the end of the conversion, the digital value of $E+S$ is stored, S always being determined with the single decoding circuit 3. The output register 5 which acts as an adder, performs the differentiation between the two digit values S and $E+S$, giving the coded value of E.

A variant to the scheme of FIG. 2, is given in FIG. 3 in which the auxiliary control circuit 8 is shown in a different position. As the auxiliary control circuit 8 is used only to memorize the digit value S in order to make it possible to perform the successive subtraction from the digit value $E+S$ of the control circuit 4, the fundamental sequence of operations remains the same as that of the example shown in FIG. 2. Thus, in FIG. 3 the control circuit 4 is used to actuate the single decoding circuit 3 also during the operation of addition of auxiliary weight S. After the operation of addition of weight S, the value of S expressed in digital form and stored in control circuit 4, is transferred into the auxiliary control circuit 8. The operation of conversion of value $E+S$ is again performed with control circuit 4 which starts again from the zero position. At the end of the conversion the digital value of the auxiliary control circuit 8 is again transferred into the control circuit 4 in order to start the successive classification with a different and new value of S, according to a predetermined law.

What we claim is:

1. Analog-to-digital converter provided with an additional circuitry for improving its differential linearity by classification of pulses depending on amplitude through introduction of pairs of thresholds relating to a plurality of the channels of the converter for the classification in each single channel, said converter comprising: a single decoding circuit means for generating, in a first time interval of the conversion, an auxiliary analog step and for generating, in a second time interval of the conversion, an analog comparison signal; control circuits connected to said single decoding circuit means for actuating it in said first and second time intervals, respectively, and for generating digital values corresponding to said auxiliary step and to the amplitude sum of said auxiliary step and the input pulse to be classified; a comparator means connected to said control circuits and to said single decoding circuit means for comparing, in said second conversion time interval, the amplitude of said sum with said analog comparison signal; and output register means receiving said digital values generated by said control circuits for deriving their difference, said difference beng the digtal value correspondng to the input amplitude.

2. Analog-to-digital converter according to claim 1 wherein said control circuits consists of a first and a second control circuit, the digital outputs of said first and second control circuits being connected with said output register means.

3. Analog-to-digital converter according to claim 1, wherein said comparator means is associated to storage means for storing said amplitude sum.

4. Analog-to-digital converter according to claim 1, wherein said single decoding circuit means is a ladder network decoding circuit.

References Cited

UNITED STATES PATENTS

| | | | |
|---|---|---|---|
| 2,836,356 | 5/1958 | Forrest et al. | 340—347 |
| 2,974,315 | 3/1961 | Lebel et al. | 340—347 |
| 3,105,231 | 9/1963 | Gordon et al. | 340—347 |
| 3,127,601 | 3/1964 | Kaenel | 340—347 |
| 3,146,343 | 8/1964 | Young | 340—347 |
| 3,164,826 | 1/1965 | McGrogan | 340—347 |
| 3,241,135 | 3/1966 | Kuflik et al. | 340—347 |
| 3,311,910 | 3/1967 | Doyle | 340—347 |

MAYNARD R. WILBUR, Primary Examiner

G. R. EDWARDS, Assistant Examiner